United States Patent
Sumita (10) Patent No.: US 10,374,199 B2
(45) Date of Patent: Aug. 6, 2019

(54) DISPLAY DEVICE AND MANUFACTURING METHOD THEREOF

(71) Applicant: Japan Display Inc., Minato-ku (JP)

(72) Inventor: Shiro Sumita, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/788,845

(22) Filed: Oct. 20, 2017

(65) Prior Publication Data

US 2018/0123089 A1 May 3, 2018

(30) Foreign Application Priority Data

Oct. 27, 2016 (JP) ................................. 2016-210938

(51) Int. Cl.
*H01L 21/66* (2006.01)
*H01L 27/32* (2006.01)
*H01L 51/00* (2006.01)
*H01L 51/52* (2006.01)
*H01L 51/56* (2006.01)

(52) U.S. Cl.
CPC .............. *H01L 51/56* (2013.01); *H01L 22/20* (2013.01); *H01L 22/32* (2013.01); *H01L 27/3223* (2013.01); *H01L 27/3276* (2013.01); *H01L 51/0031* (2013.01); *H01L 22/14* (2013.01); *H01L 51/5253* (2013.01)

(58) Field of Classification Search
CPC ............. H01L 51/5253; H01L 27/3276; H01L 27/3223; H01L 22/32; H01L 22/20; H01L 51/56
See application file for complete search history.

(56) References Cited

U.S. PATENT DOCUMENTS

| | | | | |
|---|---|---|---|---|
| 7,442,968 B2* | 10/2008 | Kim | ...................... | H01L 22/20 257/200 |
| 9,287,806 B2* | 3/2016 | Park | ...................... | H02N 13/00 |
| 9,721,505 B2* | 8/2017 | Chaji | ...................... | G06F 1/3218 |
| 2002/0119650 A1* | 8/2002 | Whetsel | ................... | H01L 22/32 438/613 |
| 2010/0072468 A1* | 3/2010 | Yamazaki | ............ | G02F 1/13458 257/43 |
| 2011/0198630 A1* | 8/2011 | Sumita | ................ | H01L 27/3258 257/89 |
| 2014/0042406 A1* | 2/2014 | Degner | ................. | H01L 27/326 257/40 |

(Continued)

FOREIGN PATENT DOCUMENTS

| JP | 10-313033 | 11/1998 |
|---|---|---|
| JP | 2000-228396 | 8/2000 |
| JP | 2015-149327 | 8/2015 |

*Primary Examiner* — Allen L Parker
*Assistant Examiner* — Charles N Ausar-El
(74) *Attorney, Agent, or Firm* — Oblon, McClelland, Maier & Neustadt, L.L.P.

(57) ABSTRACT

A display device includes: a pixel electrode formed in a display area; an organic layer formed on the pixel electrode and including a light emitting layer; a counter electrode formed on the organic layer; a sealing layer formed on the counter electrode; a drive circuit formed in a picture-frame area as an area outside the display area and controlling light emission of the light emitting layer; a first test electrode formed in the picture-frame area and electrically separated from the drive circuit; and a picture-frame insulating layer formed on the first test electrode.

3 Claims, 13 Drawing Sheets

(56) References Cited

U.S. PATENT DOCUMENTS

2017/0125451 A1\* 5/2017 Kang ................. H01L 24/05
2017/0243794 A1\* 8/2017 Sgiarovello ............ H01L 22/20
2018/0247877 A1\* 8/2018 Hong ................. H01L 22/32

\* cited by examiner

DISPLAY DEVICE AND MANUFACTURING METHOD THEREOF

CROSS-REFERENCE TO RELATED APPLICATION

The present application claims priority from Japanese application JP2016-210938 filed on Oct. 27, 2016, the content of which is hereby incorporated by reference into this application.

BACKGROUND OF THE INVENTION

1. Field of the Invention

The present invention relates to a display device and a manufacturing method of a display device.

2. Description of the Related Art

In a display device such as an organic electro luminescence (EL) display device, a self-emitting element such as an organic light emitting diode (OLED) may be controlled using a switching element such as a thin film transistor to display an image.

JP H10-313033 A discloses a semiconductor device including a check pattern including a first electrode formed in a pattern shape in a buried form in an insulating film and a second electrode formed on the upper side of the insulating film at least in an area corresponding to the first electrode.

JP 2015-149327 A discloses a semiconductor device including: a plurality of testing electrodes provided in a scribe area; a first opening formed in an insulating film in a portion overlapping the plurality of testing electrodes; a resin layer covering at least a portion of the edge of the first opening; and a conductive layer buried in a portion of the first opening not covered with the resin layer, and in contact with the testing electrodes.

The display device may include a sealing layer on a display surface side for protecting the organic light emitting diode against moisture or a physical impact. In a manufacturing step of the display device, the sealing layer is integrally formed in a display area and a picture-frame area, and thereafter, the sealing layer formed in the picture-frame area may be removed by dry etching or the like to perform terminal exposure.

However, the thickness of the sealing layer removed by dry etching or the like varies due to variations in a manufacture environment and the like. Therefore, not only the sealing layer formed in the picture-frame area but also a layer formed below the sealing layer and not intended to be etched is removed, and thus there is the risk of failure of the terminal exposure.

SUMMARY OF THE INVENTION

It is an object of the invention to provide a display device in which terminal exposure in a picture-frame area is properly performed.

A display device according to an aspect of the invention includes: a pixel electrode formed in a display area; an organic layer formed on the pixel electrode and including a light emitting layer; a counter electrode formed on the organic layer; a sealing layer formed on the counter electrode; a drive circuit formed in a picture-frame area as an area outside the display area and controlling light emission of the light emitting layer; a first test electrode formed in the picture-frame area and electrically separated from the drive circuit; and a picture-frame insulating layer formed on the first test electrode.

DETAILED DESCRIPTION OF THE INVENTION

Hereinafter, each embodiment of the invention will be described with reference to the drawings. The disclosure is illustrative only. Appropriate modifications that will readily occur to those skilled in the art and fall within the spirit of the invention are of course included in the scope of the invention. In the drawings, the width, thickness, shape, and the like of each part may be schematically represented, compared to those in practicing aspects of the invention, for more clarity of description. However, they are illustrative only and do not limit the interpretation of the invention. Moreover, in the specification and the drawings, elements similar to those described in relation to a previous drawing are denoted by the same reference numerals and signs, and a detailed description may be appropriately omitted.

Figure 1:
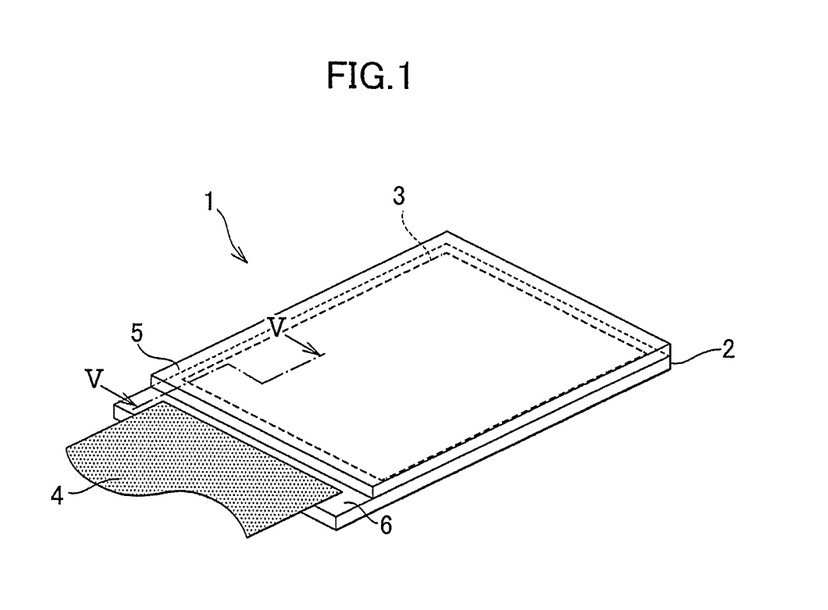
FIG. 1 is a perspective view showing an organic EL display device according to an embodiment of the invention.

FIG. 1 is a perspective view showing an organic EL display device 1 according to an embodiment of the invention. The organic EL display device 1 includes, on a substrate 2 made of glass or a material having flexibility, a display area 3 where a plurality of pixels are disposed and a picture-frame area 6 as an area outside the display area 3. A drive circuit 13 (shown in the next drawing) for controlling light emission of the plurality of pixels is formed in the picture-frame area 6 of the substrate 2. Signals and power for controlling the plurality of pixels are input via a flexible printed board (flexible print circuit (FPC)) 4. The FPC 4 is pressure-bonded and electrically connected to FPC terminals 12 (shown in the next drawing) formed on the substrate 2. The organic EL display device 1 according to the embodiment includes a counter substrate 5 that protects the display area 3. The counter substrate 5 may be a glass substrate or may be a resin film having flexibility. Moreover, the counter substrate 5 may be substituted by, for example, a surface cover glass of an electronic apparatus into which the organic EL display device 1 is incorporated.

Figure 2:
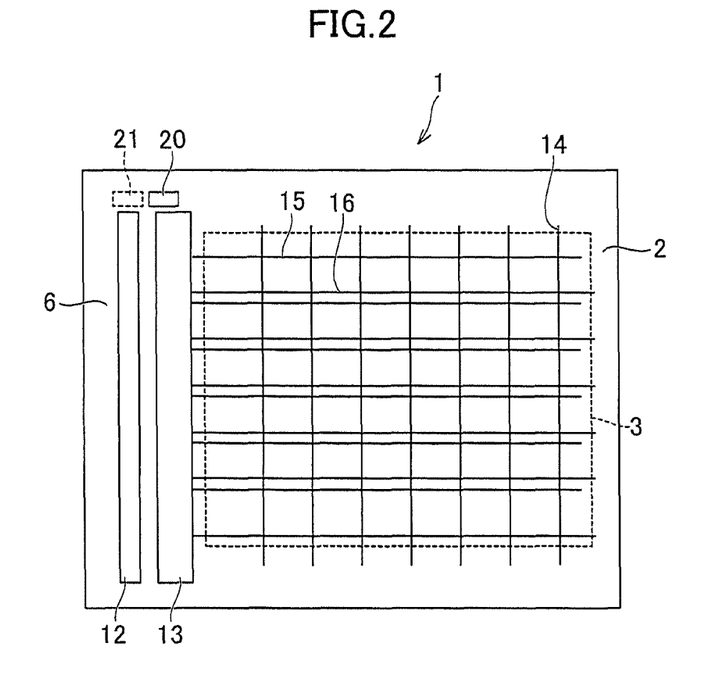
FIG. 2 is a plan view of the organic EL display device according to the embodiment of the invention.
Figure 3:
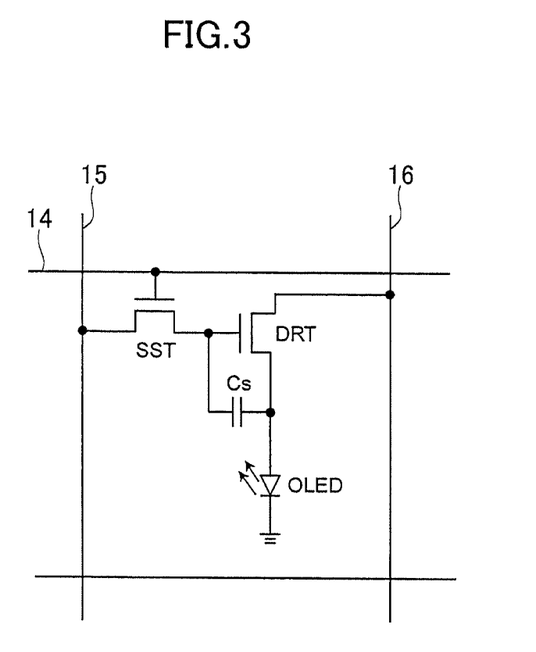
FIG. 3 is a circuit diagram of a pixel of the organic EL display device according to the embodiment of the invention.

FIG. 2 is a plan view of the organic EL display device 1 according to the embodiment of the invention. FIG. 3 is a circuit diagram of a pixel of the organic EL display device 1 according to the embodiment of the invention. The organic EL display device 1 controls the pixels provided in a matrix in the display area 3 of the substrate 2 with the drive circuit 13 to display an image. The drive circuit 13 is a circuit that generates a video signal sent to each of the pixels and a scanning signal to a thin film transistor (TFT) provided in the pixel and transmits the signals. In FIG. 2, the drive circuit 13 is shown as being formed of one circuit; however, the drive circuit 13 may be formed separately at two or more places. When the drive circuit 13 is incorporated into an integrated circuit (IC), the IC may be mounted on the substrate 2 or may be mounted on the FPC 4 shown in FIG. 1.

A scanning signal line 14 to transmit the scanning signal from the drive circuit 13 is electrically connected to a gate of a pixel transistor SST formed in each of pixel areas. The scanning signal line 14 is common to pixel transistors arranged in one row. The pixel transistor SST is a transistor whose source or drain is electrically connected to a gate of a drive transistor DRT. The drive transistor DRT is, for example, an n-type channel field-effect transistor, and a source thereof is electrically connected to an anode of an organic light emitting diode OLED. A cathode of the organic light emitting diode OLED is fixed at a ground potential or negative potential. In this case, a current flows from the anode toward the cathode in the organic light emitting diode OLED. A video signal line 15 to transmit the video signal from the drive circuit 13 is electrically connected to the source or drain of the pixel transistor SST. The video signal line 15 is common to pixel transistors arranged in one column. When the scanning signal is applied to the scanning signal line 14, the pixel transistor SST is brought into an on-state. In that state, when the video signal is applied to the video signal line 15, a video signal voltage is applied to the gate of the drive transistor DRT, a voltage in response to the video signal is written into a storage capacitor Cs, and the drive transistor DRT is brought into the on-state. A power line 16 is electrically connected to a drain of the drive transistor DRT. A power supply voltage for causing the organic light emitting diode OLED to emit light is applied to the power line 16. When the drive transistor DRT is brought into the on-state, a current in response to the magnitude of the video signal voltage flows through the organic light emitting diode OLED and thus the organic light emitting diode OLED emits light.

In the picture-frame area 6 of the substrate 2, the FPC terminals 12 to which the FPC 4 is connected, a first test electrode 21, and a second test electrode 20 are provided in addition to the drive circuit 13. The first test electrode 21 is formed in the picture-frame area 6 and formed to be electrically separated from the drive circuit 13. Moreover, the first test electrode 21 is formed below a picture-frame insulating layer 40 as will be described in detail later. The second test electrode 20 is formed on the picture-frame insulating layer 40 in the picture-frame area 6 and formed to be electrically separated from the drive circuit 13 and the first test electrode 21.

Figure 4:
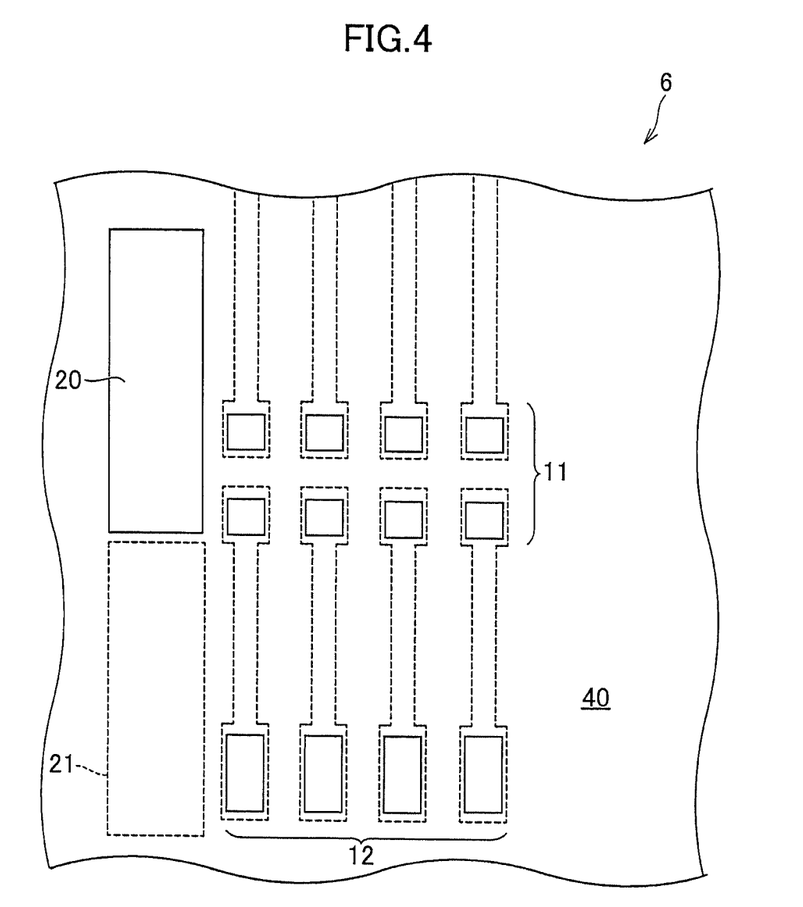
FIG. 4 is a plan view of a picture-frame area of the organic EL display device according to the embodiment of the invention.

FIG. 4 is a plan view of the picture-frame area 6 of the organic EL display device 1 according to the embodiment of the invention. FIG. 4 shows the picture-frame area 6 of the organic EL display device 1 in the state where the IC into which the drive circuit 13 is incorporated and the FPC 4 are not mounted. Drive circuit terminals 11 electrically connected with the IC into which the drive circuit 13 is incorporated and the FPC terminals 12 to which the FPC 4 is electrically connected are provided in the picture-frame area 6. The drive circuit terminals 11 and the FPC terminals 12 are composed of a plurality of electrodes or conductive layer exposed through a plurality of openings of the picture-frame insulating layer 40. The first test electrode 21 and the second test electrode 20 are formed adjacent to the drive circuit terminal 11 and the FPC terminal 12. The FPC terminals 12 are located in the same layer as the first test electrode 21.

Figure 5:
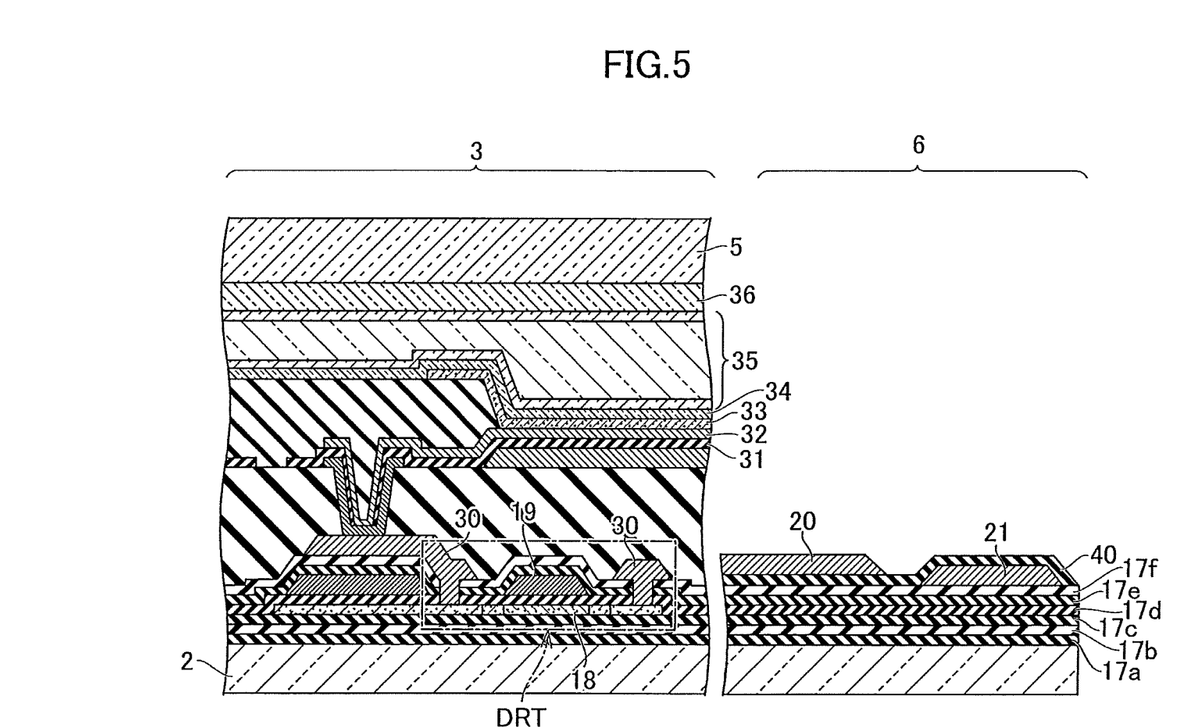
FIG. 5 is a cross-sectional view of the organic EL display device according to the embodiment of the invention.

FIG. 5 is a cross-sectional view of the organic EL display device 1 according to the embodiment of the invention. FIG. 5 is a cross-sectional view of a pixel taken along line V-V shown in FIG. 1. The left side of FIG. 5 shows a cross-section of the display area 3, while the right side shows a cross-section of the picture-frame area 6. The organic EL display device 1 according to the embodiment includes an insulating layer composed of three layers on the substrate 2. The insulating layer composed of three layers includes: a first undercoat layer 17a made of $SiO_2$; a second undercoat layer 17b made of SiN; and a third undercoat layer 17c made of $SiO_2$. A polysilicon layer 18 constituting a channel of the drive transistor DRT is provided on the insulating layer. A gate insulating film 17d made of $SiO_2$ and a gate electrode 19 are provided on the polysilicon layer 18. The gate electrode 19 is covered with a first inter-layer insulating film 17e made of SiN and a second inter-layer insulating film 17f made of $SiO_2$. The drive transistor DRT includes transistor electrodes 30 formed of metal so as to serve as a source electrode and a drain electrode. A pixel electrode 32 is electrically connected to the transistor electrode 30 via a through hole. The pixel electrode 32 is formed on an insulating layer 31.

An organic layer 33 including a light emitting layer is formed on the pixel electrode 32. The organic layer 33 is formed so as to cover an opening of a bank. A counter electrode 34 is formed on the organic layer 33. The counter electrode 34 is formed of a material that transmits light emitted from the organic layer 33. The drive circuit 13 formed in the picture-frame area 6 controls light emission of the light emitting layer included in the organic layer 33 for each of the pixels.

A sealing layer 35 is formed on the counter electrode 34. In the case of the organic EL display device 1 according to the embodiment, the sealing layer 35 is composed of three layers, in which the lowermost layer in contact with the counter electrode 34 is formed of SiN (an inorganic layer), the intermediate layer is formed of acrylic resin (an organic layer), and the uppermost layer is formed of SiN (an inorganic layer). An adhesive layer 36 is formed on the sealing layer 35, and the counter substrate 5 is bonded to the adhesive layer 36.

The first test electrode 21 electrically separated from the drive circuit 13 and the second test electrode 20 electrically separated from the drive circuit 13 and the first test electrode 21 are formed in the picture-frame area 6. The picture-frame insulating layer 40 is formed on the first test electrode 21. The second test electrode 20 is formed on the picture-frame insulating layer 40.

Figure 6:
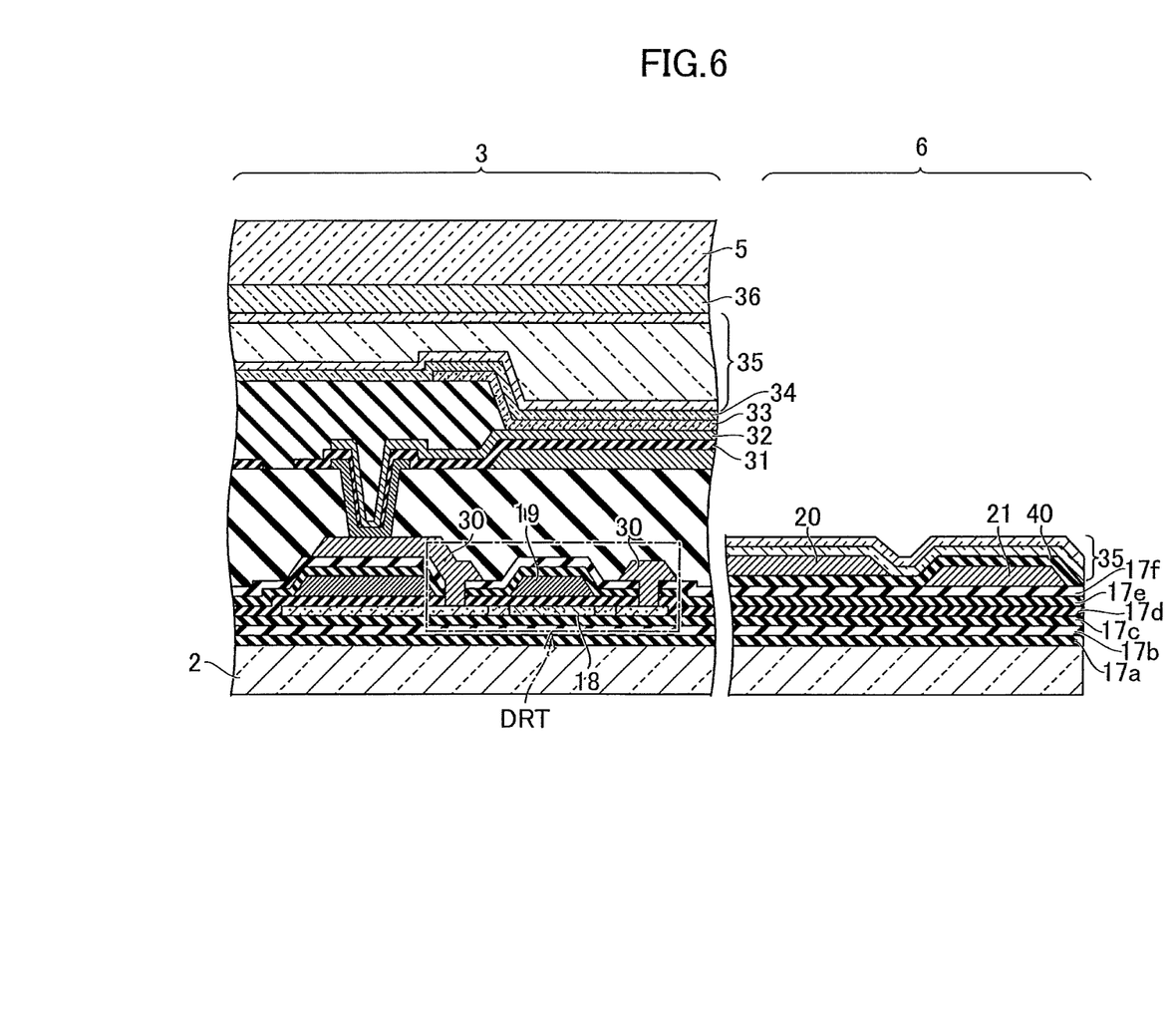
FIG. 6 is a cross-sectional view of the organic EL display device according to the embodiment of the invention in a manufacturing step.

FIG. 6 is a cross-sectional view of the organic EL display device 1 according to the embodiment of the invention in a manufacturing step. FIG. 6 shows the state immediately before performing the step of removing the sealing layer 35 formed on the electrodes (the drive circuit terminals 11) on which the drive circuit 13 is mounted. The sealing layer 35 is formed of three layers in the display area 3 while being formed of two layers of the lowermost layer and the uppermost layer in the picture-frame area 6. The sealing layer 35 prevents the entry of moisture and the like from the picture-frame area 6. The sealing layer 35 is also formed on the FPC terminals 12 and the second test electrode 20 in the picture-frame area 6.

In the manufacturing step of the organic EL display device 1 according to the embodiment of the invention, the sealing layer 35 formed in the picture-frame area 6 is removed by dry etching to perform terminal exposure of the drive circuit terminals 11 and the FPC terminals 12. In the manufacturing step of the organic EL display device 1 according to the embodiment, it is confirmed whether not only the sealing layer 35 but also the picture-frame insulating layer 40 formed below the sealing layer 35 is removed due to variations in etching environment, fluctuations in the film thickness of the sealing layer 35, or variations in the film quality of the sealing layer 35.

In the organic EL display device 1 according to the embodiment of the invention, the sealing layer 35 is removed in the picture-frame area 6 by etching. The fact that the sealing layer 35 is formed in the picture-frame area 6 and thereafter removed can be confirmed by the material of the sealing layer 35 remaining in the picture-frame area 6 or an etched mark left on the wall surface of the sealing layer 35 formed at the boundary between the display area 3 and the picture-frame area 6.

Figure 7:
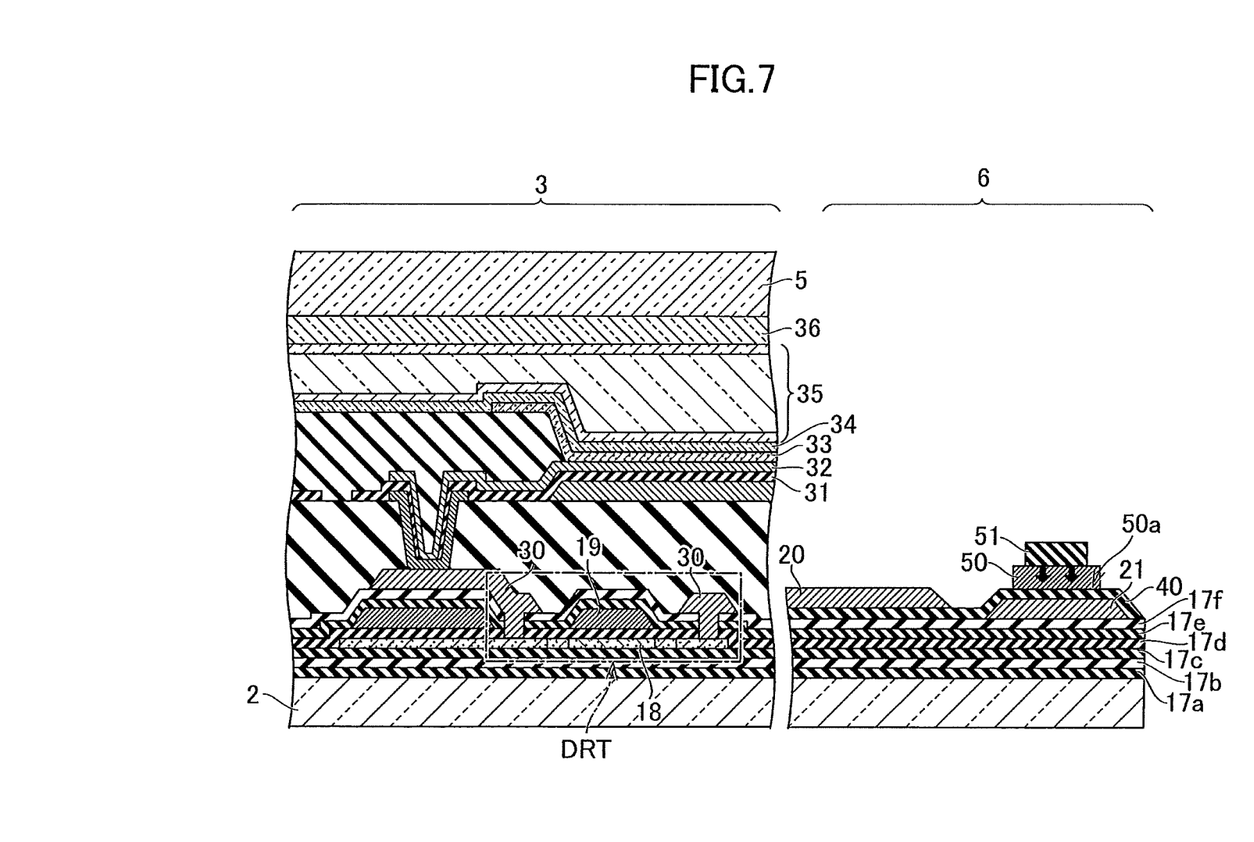
FIG. 7 is a cross-sectional view of the organic EL display device according to the embodiment of the invention in a manufacturing step.

FIG. 7 is a cross-sectional view of the organic EL display device 1 according to the embodiment of the invention in a manufacturing step. FIG. 7 shows the step performed after removing the sealing layer 35 formed in the picture-frame area 6. The step shown in FIG. 7 is a step of confirming electrical continuity by bringing a tester 50 into contact with the picture-frame insulating layer 40 on the first test electrode 21. The electrical continuity is confirmed such that the upper surface of the tester 50 is held down by a holding jig 51 to press the tester 50 against the picture-frame insulating layer 40 on the first test electrode 21.

According to a manufacturing method of the organic EL display device 1 according to an embodiment of the invention, after the sealing layer 35 formed in the picture-frame area 6 is removed, it is confirmed whether or not the picture-frame insulating layer 40 is also removed by confirming electrical continuity by bringing the tester 50 into contact with the picture-frame insulating layer 40 on the first test electrode 21, and thus it is confirmed whether terminal exposure of the drive circuit terminals 11 and the FPC terminals 12 is properly performed. Specifically, if the electrical continuity is not confirmed when the tester 50 is brought into contact with the picture-frame insulating layer 40 on the first test electrode 21, it is confirmed that the picture-frame insulating layer 40 is not removed but is left and thus it can be confirmed that the terminal exposure of the drive circuit terminals 11 and the FPC terminals 12 is properly performed. On the other hand, if the electrical continuity is confirmed when the tester 50 is brought into contact with the picture-frame insulating layer 40 on the first test electrode 21, it is confirmed that the picture-frame insulating layer 40 is also removed and thus it can be confirmed that the terminal exposure of the drive circuit terminals 11 and the FPC terminals 12 is not correctly performed.

According to the organic EL display device 1 according to the embodiment of the invention, since the first test electrode 21 formed below the picture-frame insulating layer 40 in the picture-frame area 6 is included, it can be confirmed whether or not the terminal exposure of the drive circuit terminals 11 and the FPC terminals 12 is properly performed.

The picture-frame insulating layer 40 is formed so as to cover the whole of the first test electrode 21. The drive circuit terminals 11 and the FPC terminals 12 are composed of the plurality of electrodes exposed through the plurality of openings of the picture-frame insulating layer 40, and wirings of the drive circuit terminals 11 and the FPC terminals 12 are formed below the picture-frame insulating layer 40. Therefore, confirming that the picture-frame insulating layer 40 is not removed is to confirm that the wirings of the drive circuit terminals 11 and the FPC terminals 12 are not exposed, which confirms that the terminal exposure of the drive circuit terminals 11 and the FPC terminals 12 is properly performed. According to the organic EL display device 1 according to the embodiment, since the picture-frame insulating layer 40 is formed so as to cover the whole of the first test electrode 21, the tester 50 can be brought into contact with the picture-frame insulating layer 40 formed on the first test electrode 21 and thus it can be confirmed whether the picture-frame insulating layer 40 is also removed in the step of removing the sealing layer 35.

In the organic EL display device 1 according to the embodiment of the invention, the picture-frame insulating layer 40 is formed in the same layer as the insulating layer 31 formed below the pixel electrode 32. With this configuration, the insulating layer 31 and the picture-frame insulating layer 40 can be formed at once, and a manufacturing step is simplified. Moreover, in the organic EL display device 1 according to the embodiment of the invention, the first test electrode 21 is formed in the same layer as the transistor electrode 30. With this configuration, the first test electrode 21 and the transistor electrode 30 can be formed at once, and a manufacturing step is simplified.

In the manufacturing method of the organic EL display device 1 according to the embodiment of the invention, the tester 50 is an elastic contact including a flat portion 50a. More specifically, the tester 50 is formed of a conductive rubber. The step of confirming electrical continuity by bringing the tester 50 into contact with the picture-frame insulating layer 40 on the first test electrode 21 is performed by pressing the flat portion 50a of the tester 50 against the picture-frame insulating layer 40 on the first test electrode 21. The holding jig 51 is used for pressing the flat portion 50a of the tester 50. Although a needle-like electrode can also be used as the tester 50, the confirmation of removal of the sealing layer 35 can be performed without damaging the organic EL display device 1 by using an elastic contact. Moreover, since the tester 50 includes the flat portion 50a, electrical continuity can be confirmed at the plane, and even when a portion of the picture-frame insulating layer 40 is removed, the continuity using the first test electrode 21 can be confirmed and the favorability of terminal exposure of the drive circuit terminals 11 and the FPC terminals 12 can be properly determined.

Figure 8:
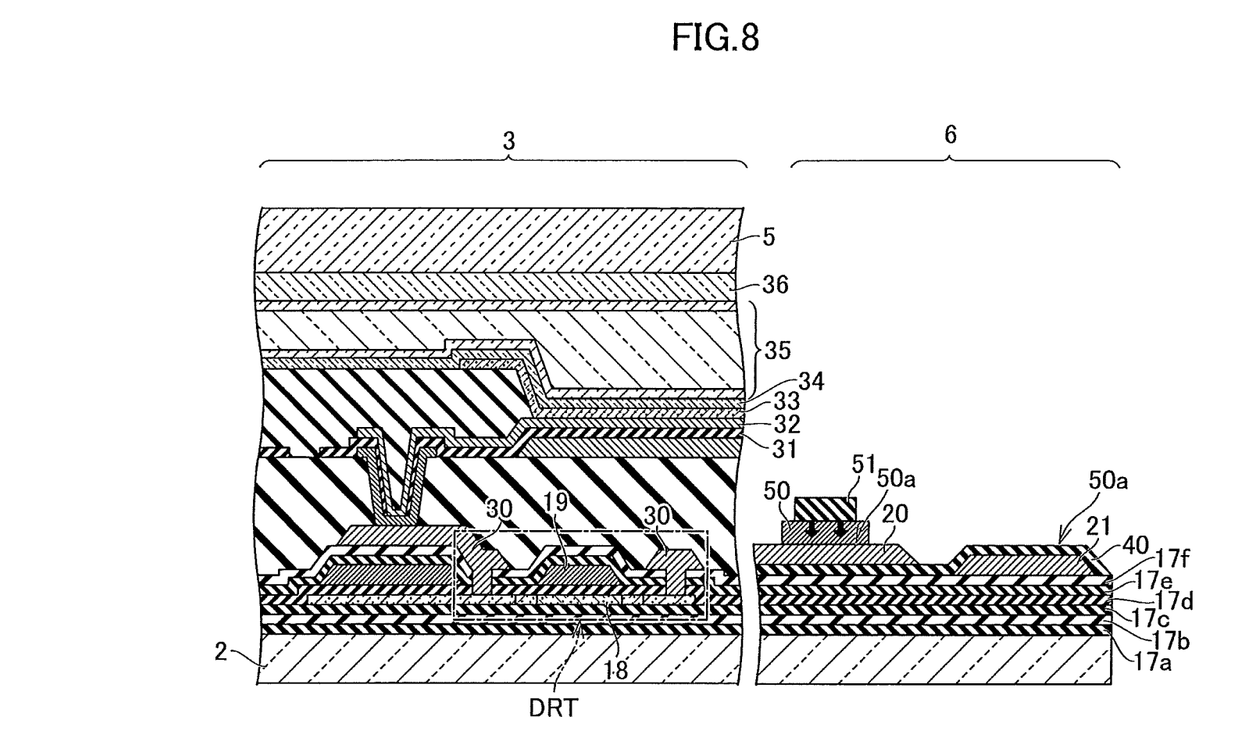
FIG. 8 is a cross-sectional view of the organic EL display device according to the embodiment of the invention in a manufacturing step.

FIG. 8 is a cross-sectional view of the organic EL display device 1 according to the embodiment of the invention in a manufacturing step. FIG. 8 shows the step performed after removing the sealing layer 35 formed in the picture-frame area 6. The step shown in FIG. 8 is a step of confirming electrical continuity by bringing the tester 50 into contact with the second test electrode 20 formed on the picture-frame insulating layer 40 and electrically separated from the drive circuit 13 and the first test electrode 21. The electrical continuity is confirmed such that the upper surface of the tester 50 is held down by the holding jig 51 to press the tester 50 against the second test electrode 20.

According to the manufacturing method of the organic EL display device 1 according to the embodiment of the invention, after the sealing layer 35 formed in the picture-frame area 6 is removed, it is confirmed whether or not the sealing layer 35 is removed by confirming electrical continuity by bringing the tester 50 into contact with the second test electrode 20, and it is confirmed whether terminal exposure of the drive circuits terminal 11 and the FPC terminals 12 is properly performed. Specifically, if the electrical continuity is confirmed when the tester 50 is brought into contact with the second test electrode 20, it is confirmed that the sealing layer 35 is removed and thus it can be confirmed that the terminal exposure of the drive circuit terminals 11 and the FPC terminals 12 is properly performed. On the other hand, if the electrical continuity is not confirmed when the tester 50 is brought into contact with the second test electrode 20, it is confirmed that the sealing layer 35 is not removed and thus it can be confirmed that the terminal exposure of the drive circuit terminals 11 and the FPC terminals 12 is not correctly performed. Also in the step of confirming the electrical continuity of the second test electrode 20, the removal of the sealing layer 35 can be confirmed with high reliability without damaging the organic EL display device 1 by pressing the flat portion 50a of the tester 50 as an elastic contact.

According to the organic EL display device 1 according to the embodiment of the invention, since the second test electrode 20 formed on the picture-frame insulating layer 40 is included, it can be confirmed whether or not the terminal exposure of the drive circuit terminals 11 and the FPC terminals 12 due to the removal of the sealing layer 35 is properly performed.

The manufacturing method of the organic EL display device 1 according to the embodiment of the invention further includes a step of changing an etching rate in the step of removing the sealing layer 35 based on a confirmation result of the step of confirming electrical continuity by bringing the tester 50 into contact with the picture-frame insulating layer 40 on the first test electrode 21 or the step of confirming electrical continuity by bringing the tester 50 into contact with the second test electrode 20. When the electrical continuity is confirmed by bringing the tester 50 into contact with the picture-frame insulating layer 40 on the first test electrode 21, the etching rate is changed so as to be reduced because etching is excessive. Moreover, when the electrical continuity is not confirmed by bringing the tester 50 into contact with the second test electrode 20, the etching rate is changed so as to be increased because etching is insufficient. In this manner, even when the etching environment and the like vary, etching conditions can be changed so that the terminal exposure is properly performed.

Figure 9:
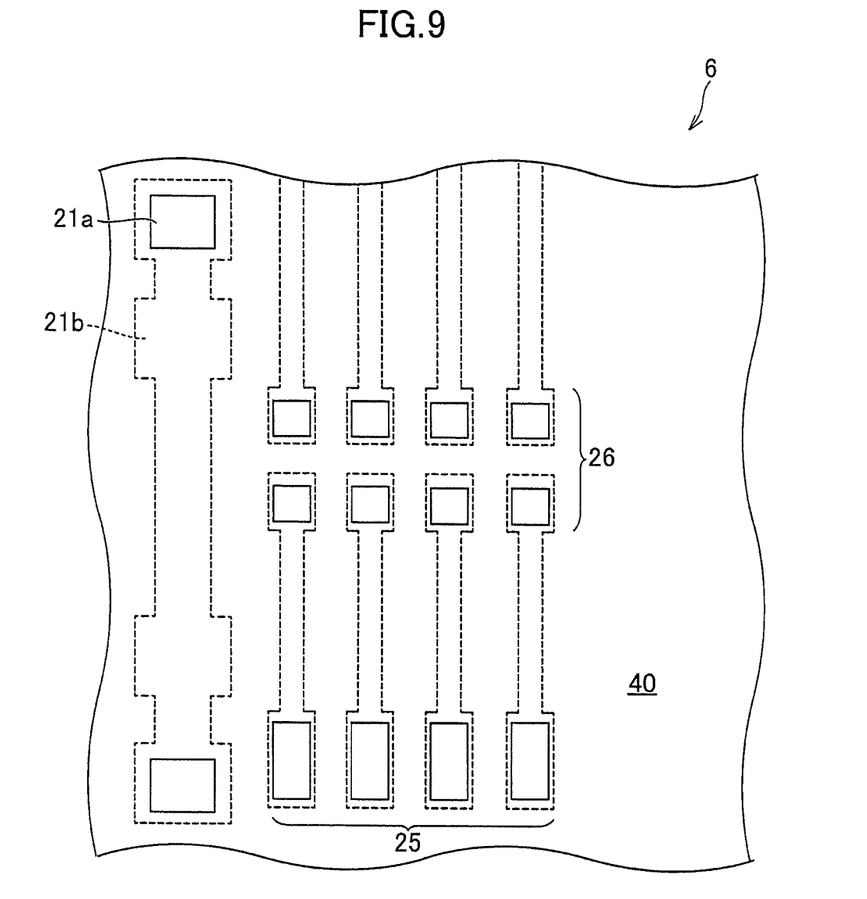
FIG. 9 is a plan view of a picture-frame area of an organic EL display device according to a modified example of the embodiment of the invention.

FIG. 9 is a plan view of the picture-frame area 6 of the organic EL display device 1 according to a modified example of the embodiment of the invention. In the organic EL display device 1 according to the modified example, the picture-frame insulating layer 40 is formed so as to expose a portion of the first test electrode 21. The first test electrode 21 includes an exposed portion 21a exposed from the picture-frame insulating layer 40 and a covered portion 21b covered by the picture-frame insulating layer 40. Other than the configuration described above, the configuration of the organic EL display device 1 according to the modified example is similar to that of the organic EL display device 1 according to the embodiment.

Figure 10:
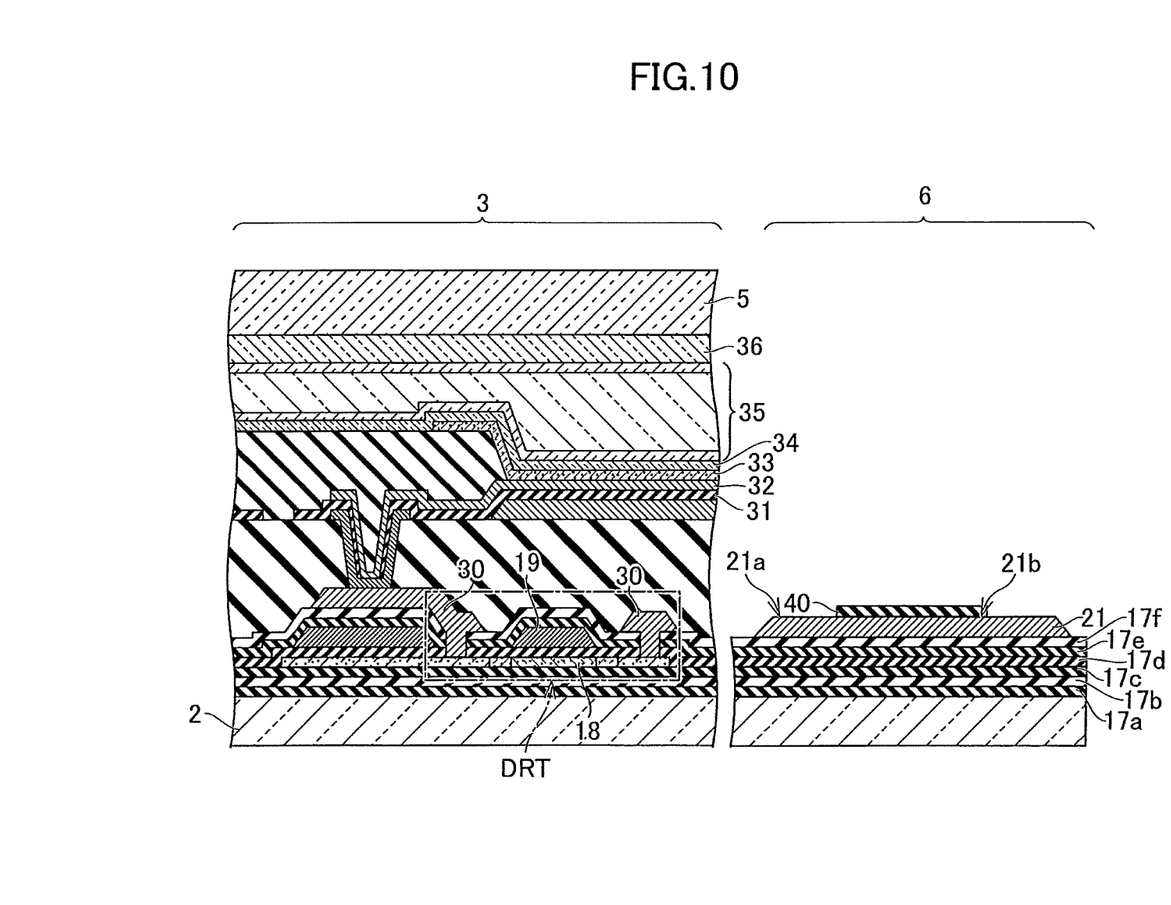
FIG. 10 is a cross-sectional view of the organic EL display device according to the modified example of the embodiment of the invention.

FIG. 10 is a cross-sectional view of the organic EL display device 1 according to the modified example of the embodiment of the invention. In the picture-frame area 6 of the organic EL display device 1 according to the modified example, the first test electrode 21 electrically separated from the drive circuit 13 is formed. The picture-frame insulating layer 40 is formed on the first test electrode 21 so as to expose a portion of the first test electrode 21. The first test electrode 21 includes the exposed portion 21a exposed from the picture-frame insulating layer 40 and the covered portion 21b covered by the picture-frame insulating layer 40.

Figure 11:
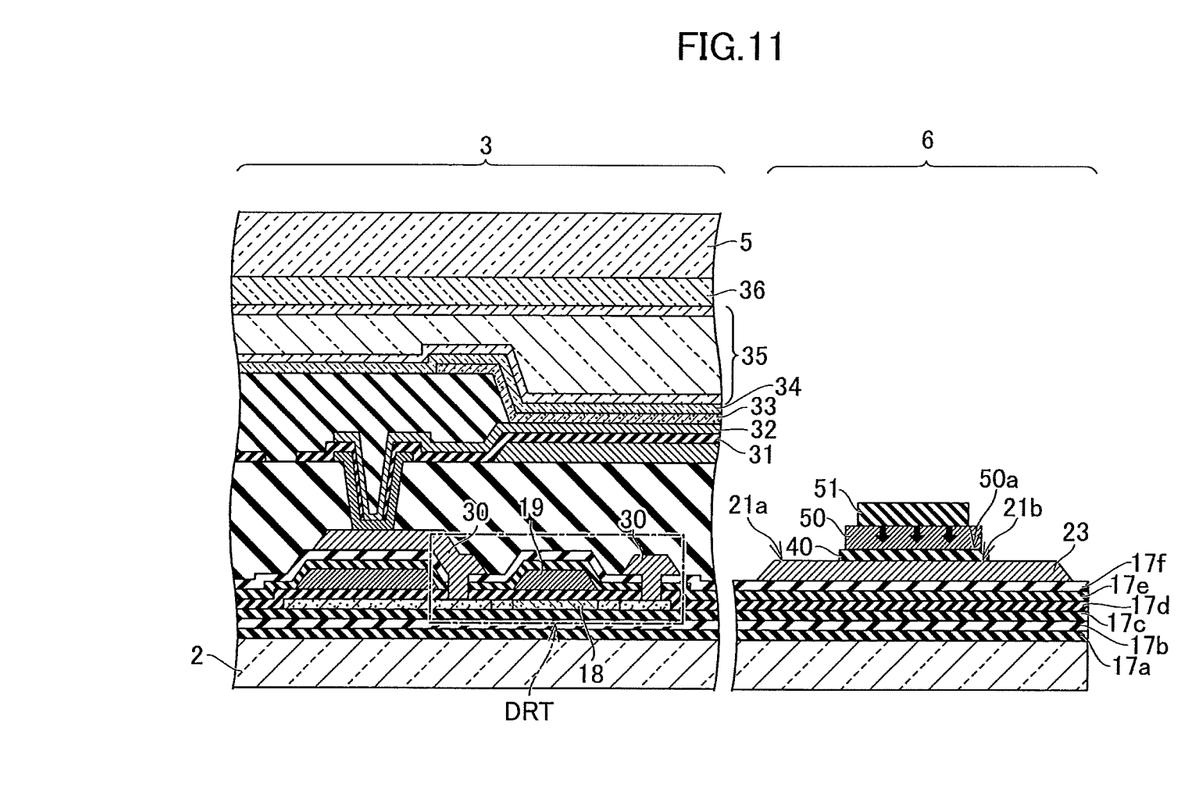
FIG. 11 is a cross-sectional view of the organic EL display device according to the modified example of the embodiment of the invention in a manufacturing step.

FIG. 11 is a cross-sectional view of the organic EL display device 1 according to the modified example of the embodiment of the invention in a manufacturing step. FIG. 11 shows the step performed after removing the sealing layer 35 formed in the picture-frame area 6. The step shown in FIG. 11 is a step of confirming electrical continuity by bringing the tester 50 into contact with the picture-frame insulating layer 40 on the first test electrode 21. The electrical continuity is confirmed such that the upper surface of the tester 50 is held down by the holding jig 51 to press the tester 50 against the picture-frame insulating layer 40 on the covered portion 21b of the first test electrode 21.

According to the manufacturing method of the organic EL display device 1 according to the embodiment of the invention, after the sealing layer 35 formed in the picture-frame area 6 is removed, it is confirmed whether or not the picture-frame insulating layer 40 is also removed by confirming electrical continuity by bringing the tester 50 into contact with the picture-frame insulating layer 40 on the covered portion 21b of the first test electrode 21, and it is confirmed whether terminal exposure of the drive circuit terminals 11 and the FPC terminals 12 is properly performed. Specifically, if the electrical continuity is not confirmed when the tester 50 is brought into contact with the picture-frame insulating layer 40 on the covered portion 21b of the first test electrode 21, it is confirmed that the picture-frame insulating layer 40 is not removed but is left and thus it can be confirmed that the terminal exposure of the drive circuit terminals 11 and the FPC terminals 12 is properly performed. On the other hand, if the electrical continuity is confirmed when the tester 50 is brought into contact with the picture-frame insulating layer 40 on the covered portion 21b of the first test electrode 21, it is confirmed that the picture-frame insulating layer 40 is also removed and thus it can be confirmed that the terminal exposure of the drive circuit terminals 11 and the FPC terminals 12 is not correctly performed.

Figure 12:
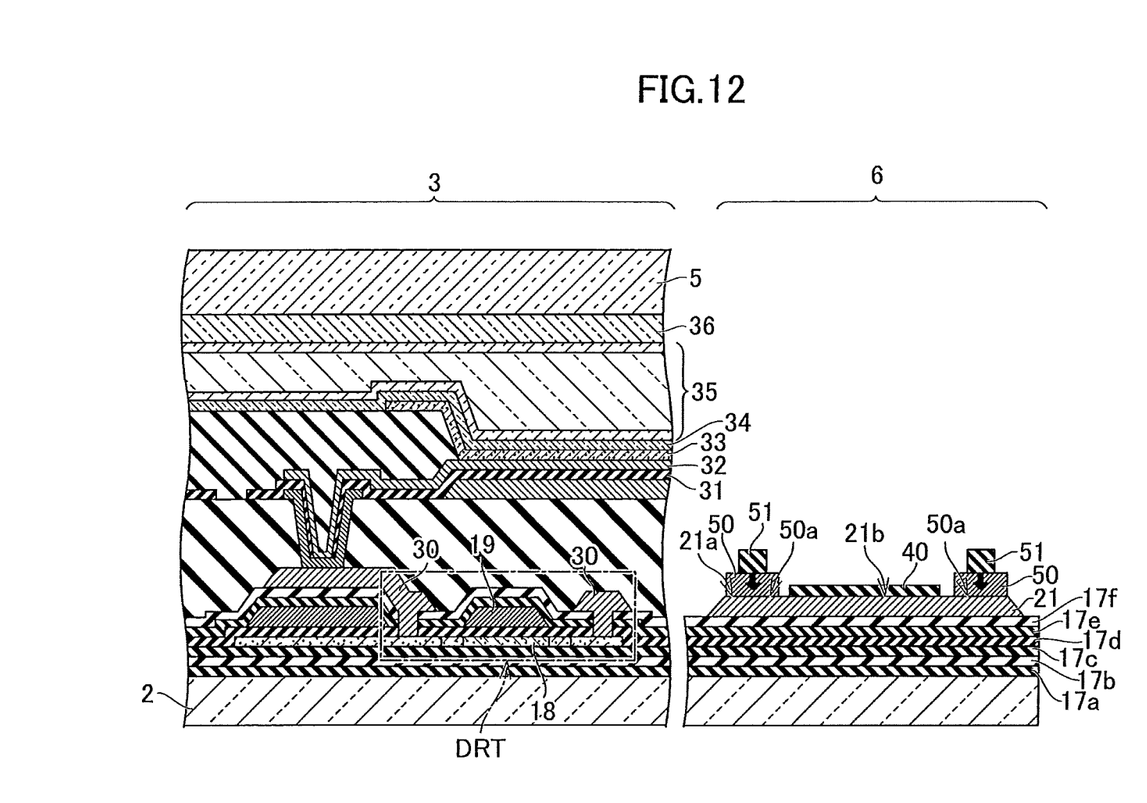
FIG. 12 is a cross-sectional view of the organic EL display device according to the modified example of the embodiment of the invention in a manufacturing step.

FIG. 12 is a cross-sectional view of the organic EL display device 1 according to the modified example of the embodiment of the invention in a manufacturing step. FIG. 12 shows the step performed after removing the sealing layer 35 formed in the picture-frame area 6. The step shown in FIG. 12 is a step of confirming electrical continuity by bringing the tester 50 into contact with the exposed portion (the exposed portion 21a) of the first test electrode 21. The electrical continuity is confirmed such that the upper surface of the tester 50 is held down by the holding jig 51 to press the tester 50 against the exposed portion 21a of the first test electrode 21.

According to the manufacturing method of the organic EL display device 1 according to the embodiment of the invention, after the sealing layer 35 formed in the picture-frame area 6 is removed, it is confirmed whether or not the sealing layer 35 is removed by confirming electrical continuity by bringing the tester 50 into contact with the exposed portion 21a of the first test electrode 21 and thus it is confirmed whether terminal exposure of the drive circuit terminals 11 and the FPC terminals 12 is properly performed. Specifically, if the electrical continuity is confirmed when the tester 50 is brought into contact with the exposed portion 21a of the first test electrode 21, it is confirmed that the sealing layer 35 is removed and thus it can be confirmed that the terminal exposure of the drive circuit terminals 11 and the FPC terminals 12 is properly performed. On the other hand, if the electrical continuity is not confirmed when the tester 50 is brought into contact with the exposed portion 21a of the first test electrode 21, it is confirmed that the sealing layer 35 is not removed and thus it can be confirmed that the terminal exposure of the drive circuit terminals 11 and the FPC terminals 12 is not correctly performed.

Figure 13:
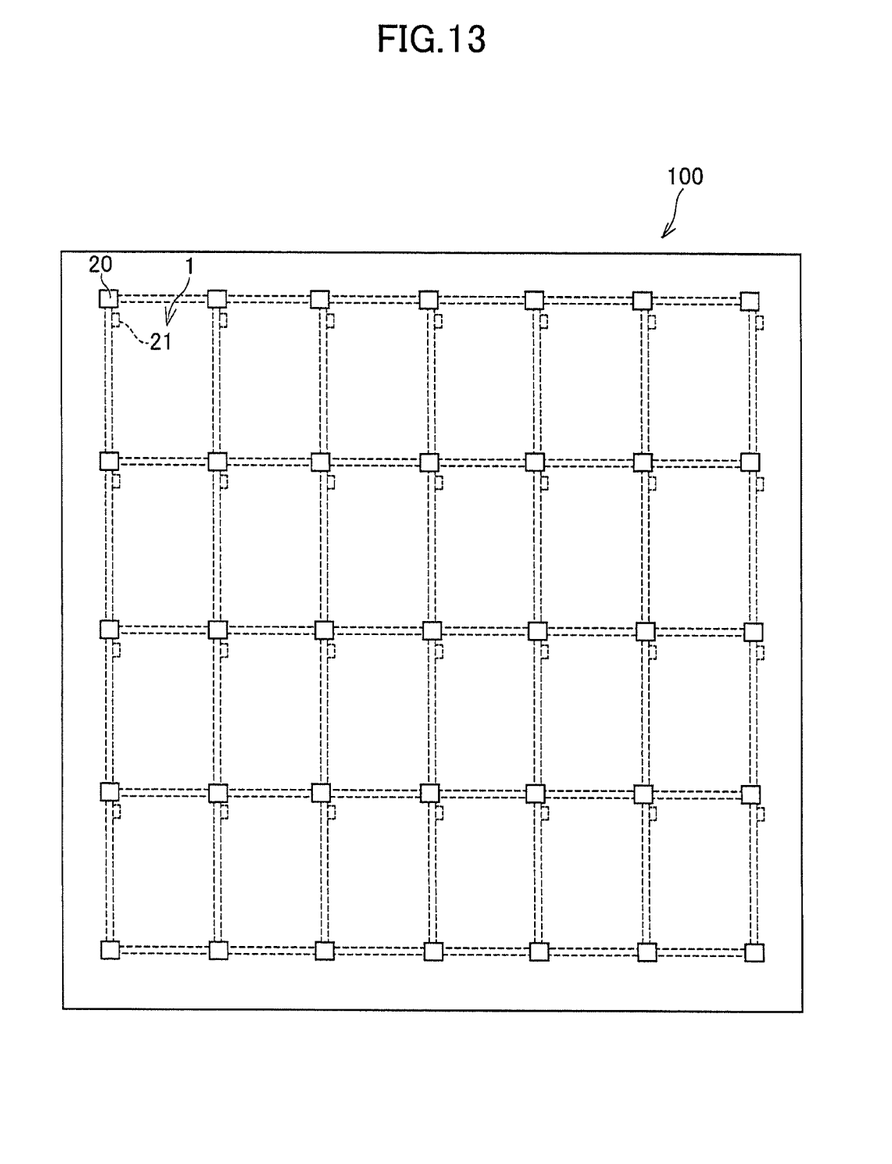
FIG. 13 is a plan view of the organic EL display device according to the embodiment of the invention in a manufacturing step.

FIG. 13 is a plan view of the organic EL display device according to the embodiment of the invention in a manufacturing step. FIG. 13 shows an organic EL wafer 100 from which a plurality of the organic EL display devices 1 are cut out. In the organic EL wafer 100, the first test electrode 21 and the second test electrode 20 are provided at four corners of a plurality of rectangular areas where the organic EL display devices 1 are cut out. The first test electrode 21 and the second test electrode 20 may be provided at a position that is cut off when the organic EL display device 1 is cut out from the organic EL wafer 100.

Even in the case of the first test electrode 21 and the second test electrode 20 shown in FIG. 13, after the sealing layer 35 is formed on the entire surface of the organic EL wafer 100 and the sealing layer 35 in the picture-frame area 6 is removed, the step of confirming electrical continuity by bringing the tester 50 into contact with the picture-frame insulating layer 40 on the first test electrode and the step of confirming electrical continuity by bringing the tester 50 into contact with the second test electrode 20 are performed. As a result, it is confirmed whether or not the sealing layer 35 is correctly removed and whether or not the picture-frame insulating layer 40 is also removed, and it is confirmed whether terminal exposure of the drive circuit terminals 11 and the FPC terminals 12 is properly performed. Moreover, it can be confirmed, before cutting out the organic EL display device 1 from the organic EL wafer 100, whether or not the terminal exposure is properly performed, and thus waste in the manufacturing step can be avoided.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a substrate including a display area including a plurality of pixel electrodes arranged therein, the substrate including a picture-frame area outside the display area;
a wiring pattern including terminals arranged in the picture-frame area;
an organic layer formed on the pixel electrodes and including a light emitting layer;
a counter electrode formed on the organic layer;
a sealing layer formed on the counter electrode;
a drive circuit formed in the picture-frame area for controlling light emission of the light emitting layer;
a first test electrode formed in the picture-frame area and electrically separated from the drive circuit;
a second test electrode formed in the picture-frame area electrically separated from the drive circuit and the first test electrode; and
a picture-frame insulating layer formed on the wiring pattern and including openings to expose the respective terminals, the picture-frame insulating layer formed entirely on and in direct contact with an upper surface of the first test electrode, the picture-frame insulating layer formed entirely below and in direct contact with a lower surface of the second test electrode,
wherein the first test electrode and the second test electrode are displaced from each other so as not to be overlapped in a plan view, and
the first test electrode and the second test electrode are adjacent to at least one of the terminals in the plan view.

2. The display device according to claim 1, wherein the picture-frame insulating layer is formed in the same layer as an insulating layer formed below the pixel electrodes.

3. The display device according to claim 1, further comprising:
a flexible printed board connected to some of the terminals, wherein
the terminals are located in a layer that is below the picture-frame insulating layer and in the same layer as the first test electrode, and include a conductive layer exposed from the picture-frame insulating layer.

* * * * *